(12) United States Patent
Popescu et al.

(10) Patent No.: US 9,255,791 B2
(45) Date of Patent: Feb. 9, 2016

(54) OPTICALLY MONITORING AND CONTROLLING NANOSCALE TOPOGRAPHY

(71) Applicant: The Board of Trustees of the University of Illinois, Urbana, IL (US)

(72) Inventors: Gabriel Popescu, Champaign, IL (US); Lynford Goddard, Champaign, IL (US); Chris Edwards, Mahomet (IL); Amir Arbabi, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 203 days.

(21) Appl. No.: 13/630,286

(22) Filed: Sep. 28, 2012

(65) Prior Publication Data

US 2014/0093986 A1 Apr. 3, 2014

(51) Int. Cl.
*G01B 9/02* (2006.01)
*G01B 11/24* (2006.01)
*H01L 21/66* (2006.01)

(52) U.S. Cl.
CPC ............. *G01B 11/2441* (2013.01); *H01L 22/12* (2013.01)

(58) Field of Classification Search
CPC .................................................. G01B 11/2441
USPC ......................................................... 356/450
See application file for complete search history.

(56) References Cited

U.S. PATENT DOCUMENTS

| 6,930,807 | B1 * | 8/2005 | Shimomura et al. | 358/505 |
| 6,975,457 | B1 * | 12/2005 | Greenaway et al. | 359/565 |
| 7,586,618 | B2 * | 9/2009 | Marks et al. | 356/451 |
| 2005/0150880 | A1 * | 7/2005 | Gu et al. | 219/121.69 |
| 2009/0147268 | A1 * | 6/2009 | Groot | 356/511 |
| 2011/0037964 | A1 * | 2/2011 | Imamura | 356/3.13 |

OTHER PUBLICATIONS

Popescu et al., "Diffraction phase microscopy for quantifying cell structure and dynamics," *Opt. Lett.*, vol. 31, No. 6, pp. 775-777 (Mar. 2006).

* cited by examiner

*Primary Examiner* — Tarifur Chowdhury
*Assistant Examiner* — Omar Nixon
(74) *Attorney, Agent, or Firm* — Sunstein Kann Murphy & Timbers LLP

(57) ABSTRACT

Methods and apparatus for method for characterizing a height profile of a scattering surface relative to a fiducial plane. The scattering surface, which may be an interface between distinct solid, liquid, gaseous or plasma phases, is illuminated with substantially spatially coherent light, and light scattered by the scattering surface is collected and dispersed, such as by a grating, into zeroth- and first-order beams. A spatial Fourier transform of the zeroth- and first-order beams is created, and one of the beams is low-pass filtered. The beams are interfered at a focal plane detector to generate an interferogram, which is transformed to retrieve a spatially resolved quantitative phase image and/or an amplitude image of the scattering surface. Imaging may be performed during an etching process, and may be used to adaptively control a photoetching process in a feedback loop.

19 Claims, 8 Drawing Sheets

OPTICALLY MONITORING AND CONTROLLING NANOSCALE TOPOGRAPHY

This invention was made with government support under Grants CBET 1040462, awarded by the National Science Foundation. The Government has certain rights in the invention.

TECHNICAL FIELD

The present invention relates to methods and apparatus for monitoring dynamic processes at interfaces between media of distinct optical properties in real time, and, more particularly, to interferometric methods for monitoring and controlling photochemical etching, or liquid-solid-air interfaces, for example.

BACKGROUND ART

In order to produce properly functioning semiconductor devices, tight dimensional control is typically required during nanofabrication. In processes such as growth or etching, control of feature size, especially height, is often performed by carrying out an initial calibration run on a dummy wafer, which includes a post-process measurement to determine the growth or etching rate. After this preliminary calibration, the fabrication is run on the real wafer under the same processing conditions, followed again by a post-processing measurement check. This iterative approach has obvious drawbacks including the added time and cost of duplicate runs, variation due to system drift, and lack of adaptive process control. Further, the characterization measurement often requires destruction of the sample. It is clear that accurate, non-destructive, real-time in-situ monitoring is highly desirable as it enables feedback and fine adjustment of the processing conditions.

In various fields, optical characterization methods fulfill the need for nondestructive testing. Examples include point measurement techniques such as spectroscopic ellipsometry, phase sensitive ellipsometry, laser reflectometry, multi-beam interferometry, and emission spectroscopy. In the case of semiconductor fabrication, it is typical practice to measure a structure height at a single point or region of interest and to infer information across the wafer on the basis of an assumption that the process is uniform. While this might be adequate for most planar processes, it is well known that the growth and etch rates in high-aspect-ratio structures, such as at the bottom of a trench, depend on the width of the opening. Consequently, methods based on imaging rather than on single-point measurements would be preferred.

Accordingly, imaging ellipsometry has recently been used to monitor the removal of large-area biomolecules during plasma etching. While the sensitivity of these single point or imaging methods can be a few nanometers; however, the measurements are typically hindered by vibrations and drift in the sample. Maintaining nanoscale accuracy in noisy environments is particularly difficult and represents the main challenge in developing real-time monitoring of dynamic fabrication processes such as wet etching.

During the past decade or so, techniques of quantitative phase imaging (QPI) have been developed for mapping an optical path length shift created by a sample at each point in an image. In particular, some QPI techniques may provide information at the nanoscale about the structure and dynamics of the specimen under investigation. One such QPI technique is diffraction phase microscopy (DQM), described in Popescu et al., *Diffraction phase microscopy for quantifying cell structure and dynamics*, Opt. Lett., vol. 31, pp. 775-77 (2006), incorporated herein by reference, which is both off-axis and common-path, thereby combining the benefits of fast acquisition rates and high temporal sensitivity.

SUMMARY OF EMBODIMENTS OF THE INVENTION

In accordance with embodiments of the invention, methods and apparatus are provided for characterizing a height profile of a scattering surface relative to a fiducial plane. A method in accordance with the present invention has steps of:
a. illuminating the scattering surface with substantially spatially coherent light;
b. collecting light scattered by the scattering surface;
c. dispersing the scattered light into zeroth- and first-order beams;
d. creating a spatial Fourier transform of the zeroth- and first-order beams;
e. low-pass filtering one of the zeroth and first-order beams in a Fourier plane;
f. interfering the zeroth- and first-order beams at a focal plane detector to generate an interferogram; and
g. transforming the interferogram to retrieve at least one of a spatially resolved quantitative phase image and a quantitative amplitude image of the scattering surface.

In other embodiments of the present invention, the scattering surface may be disposed at an interface between a solid and a surrounding tenuous medium. The step of dispersing the scattered light may include grating diffraction. A further step of converting the spatially resolved quantitative phase image into a height image may also be provided.

In yet other embodiment of the present invention, the step of illuminating may further include diffusing illuminating light. Transforming the interferogram may include performing a spatial Hilbert transform, as well as unwrapping phase by application of a branch cut algorithm.

Low-pass filtering may be performed by means of a pinhole, and by means of a spatial light modulator disposed in the Fourier plane.

The scattering surface, in accordance with certain embodiments of the invention, may be a semiconductor, and, more particularly, a semiconductor concurrently undergoing semiconductor processing, and, even more particularly, a semiconductor undergoing a process selected from the group of including chemical etching, dry etching, chemical-mechanical planarization, polishing and backside grinding, epitaxial growth, regrowth, material deposition, coating, lithographic patterning, or material modification through UV exposure, ion implantation, plasma ashing, baking, annealing, oxidation and surface passivation.

In accordance with another aspect of the present invention, an epi-diffraction phase microscope is provided that has a source of a substantially spatially coherent illuminating beam, and an objective lens for collecting light from the source as scattered by a scattering surface and forming an image at an output port. The microscope also has a grating for relaying a zeroth order beam and for diffracting the image into a first-order diffracted beam, and a first Fourier lens for transforming the zeroth-order beam and first-order diffracted beam into respective Fourier transform fields in a Fourier transform plane. A Fourier transform space mask low-pass filters one of the zeroth-order and first-order beams in the Fourier transform plane, and a second Fourier lens for recombining the zeroth-order beam and first-order diffracted beam at a focal plane detector.

In other embodiments of the invention, the epi-diffraction phase microscope may also have a diffuser for diffusing the substantially spatially coherent illuminating beam prior to illumination of the scattering surface. The Fourier transform space mask may be implemented by a pinhole, and by a spatial light modulator. The grating may, more particularly, be a transmission grating.

In an alternate embodiment of the invention, a method is provided for fabricating structures on a surface of a semiconductor. The method has steps of:
 a. subjecting the surface to a wet etching solution;
 b. projecting illumination onto the surface so as to generate a pattern of specified intensity;
 c. measuring a height profile of the surface using a method in accordance with any of claims 1-10; and
 d. regulating the pattern of specified intensity so as to achieve a specified target height profile.

In other embodiments of the invention, the pattern of specified intensity may include a pattern of both specified intensity and color distribution.

BRIEF DESCRIPTION OF THE DRAWINGS

The foregoing features of the invention will be more readily understood by reference to the following detailed description, taken with reference to the accompanying drawings, in which.

DETAILED DESCRIPTION OF EMBODIMENTS OF THE INVENTION

Definitions

The term "image" shall refer to any multidimensional representation, whether in tangible or otherwise perceptible form, or otherwise, whereby a value of some characteristic (amplitude, phase, etc.) is associated with each of a plurality of locations corresponding to dimensional coordinates of an object in physical space, though not necessarily mapped one-to-one thereonto. Thus, for example, the graphic display of the spatial distribution of some field, either scalar or vectorial, such as brightness or color, constitutes an image. So, also, does an array of numbers, such as a 3D holographic dataset, in a computer memory or holographic medium. Similarly, "imaging" refers to the rendering of a stated physical characteristic in terms of one or more images.

The terms "object," "sample," and "specimen" shall refer, interchangeably, to a tangible, non-transitory physical object capable of being rendered as an image.

The term "temporally incoherent" as applied to a source of irradiation shall refer to a source characterized by a coherence time $\tau_c$ that is no longer than 10 cycles of a central frequency of the light emitted by the source.

The term "substantially spatially coherent" as applied to a beam of light shall denote a condition of coherence wherein if two slits were to be placed within the beam in a plane transverse to the beam propagation axis, at least one interference null would result in the far field where the intensity is no greater than 10% of the peak intensity of the beam.

Figure 1:
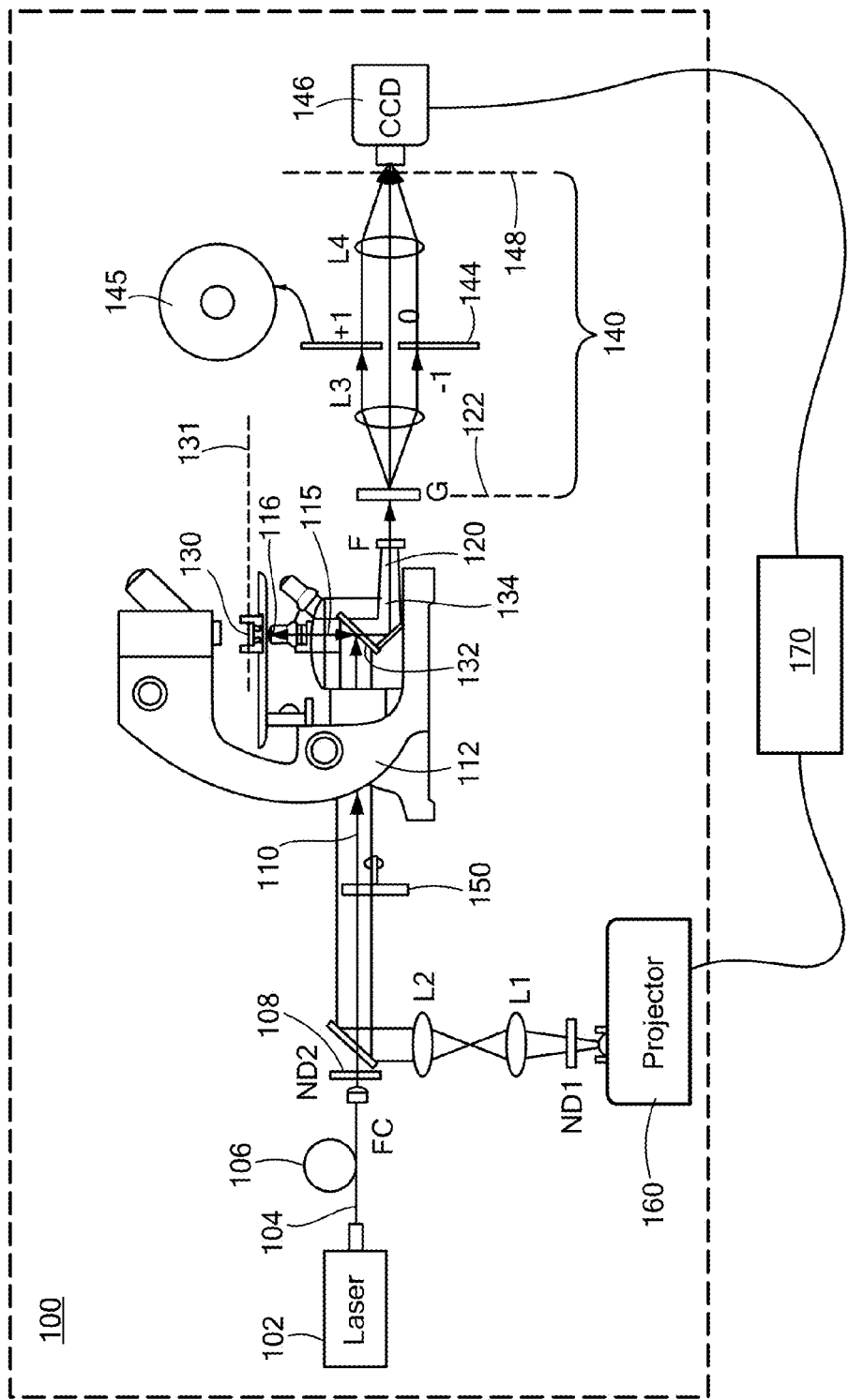
FIG. 1 is a schematic depiction of an epi-diffraction phase microscope in accordance with an embodiment of the present invention.

An apparatus for monitoring a semiconductor fabrication process, denoted an epi-diffraction phase microscope, and designated generally by numeral 100, is now described with reference to FIG. 1. As shown in FIG. 1, light 104 is provided by epi-illumination source 102, such as a frequency-doubled Nd:YAG laser emitting light at 532 nm. The emitted light 104 (a laser beam, in the embodiment depicted) is coupled into a single mode fiber 106, and then collimated, which ensures substantial spatial coherence of the output field (otherwise referred to as collimated light) 108. Other means for achieving a substantially spatially coherent illumination are within the scope of the present invention. Collimated light 108, via fiber coupler FC and neutral density filter ND2, then enters a back port 110 of an inverted microscope 112 and is imaged at a sample plane 118 after passing through an objective lens 116. Thus, light 120 is again a collimated beam after the objective 116, and may be filtered by filter F to select light at the wavelength of substantially spatial coherent source 102. Light 115 reflected or scattered from a sample 130 of interest is collected through the same objective 116, and directed via a beam splitter 132 toward a side output port 134 of the microscope. In preferred embodiments of the invention, sample 130 is a scattering surface characterized by a height profile relative to a fiducial plane. (A "fiducial plane" refers to any plane chosen as a reference plane with respect to which heights on the sample are referenced, for example, a plane of a substrate, such as a semiconductor wafer.) More particularly, sample 130 may be a semiconductor wafer undergoing processing, such as etching, and, more particularly, chemical etching. The semiconductor may be undergoing any other processing, as well, including, without limitation, such processes as dry etching, chemical-mechanical planarization, polishing and backside grinding, epitaxial growth, regrowth, material deposition, coating, lithographic patterning, or material modification through UV exposure, ion implantation, plasma ashing, baking, annealing, oxidation and surface passivation.

Within the scope of the present invention, the scattering surface associated with sample 130 may be any interface giving rise to a discontinuity in refractive index across the interface. Thus, in the context of semiconductor processing, the interface may be between the solid semiconductor and a tenuous medium such as a partial vacuum in which the semiconductor is processed.

In other embodiments of the invention, the interface constituting sample 130 may be an interface between a solid and a liquid or between a liquid and a gas or between a solid and a gas or between a plasma and a solid or between a plasma and a liquid or between a plasma and a gas, for example.

In order to quantify the phase shift distribution across the field of view with high stability, a compact Mach-Zehnder interferometer, designated generally by numeral 140 is comprised of the following salient components. A diffraction grating G is disposed at an image plane 122 of the microscope 112 such that multiple copies of an image of sample 130 are generated at different angles. It may be noted that a magnified replica is obtained, at image plane 122, of the field reflected by sample 130. In one embodiment of the present invention, diffraction grating G has 300 grooves/mm, blazed at an angle to maximize the power in the 1st diffraction order. Lens L3 is used to generate a Fourier transform of the image field at its back focal plane 144. At this Fourier plane 144, the 1st order beam is filtered down using a pinhole 145 (10-μm diameter, in the embodiment depicted), such that after passing through a second lens L4 this field approaches a plane wave and, thus, can be used as the reference of interferometer 140. The original image is carried by the 0th order, which is combined with the reference field at the charge-coupled device (CCD) camera plane 148 and creates an interferogram that has the following irradiance distribution:

$$I(x,y)=I_1+I_0(x,y)+2\sqrt{I_1 I_0(x,y)}\cos[\beta x+\phi(x,y)], \quad (1)$$

where $I_0$ is the irradiance of the 0th diffraction order, $I_1$ is the irradiance of the 1st diffraction order after passing the pinhole, $\beta$ is the spatial modulation frequency provided by the grating, and $\phi$ is the phase of interest. The interferogram is converted to an electrical signal by a camera 146.

A rotating diffuser 150 may be inserted into the path of collimated light 108 in order to reduce speckle associated with the laser light, and thereby significantly reduce the spatial phase noise floor. Moreover, rotating diffuser 150 also dithers the image, reducing quantization error.

From the interferogram of Eq. (1), a quantitative phase image is obtained via a spatial Hilbert transform, as described in detail in Ikeda et al., *Hilbert phase microscopy for investigating fast dynamics in transparent systems*, Opt. Lett., vol. 30, pp. 1165-67 (2005), which is incorporated herein by reference. The phase is then unwrapped using Goldstein's branch cut algorithm, as described in Ghiglia et al., *Two-Dimensional Phase Unwrapping: Theory, Algorithms, and Software* (Wiley, 1998), incorporated herein by reference. The phase is then converted into a height image, based on the fact that the phase delay, on reflection, scales directly with distance to a fiducial plane.

Sample 130 may be further illuminated by an incoherent source such as projector 160 for purposes of photochemical etching enhancement, as described below.

Figure 2:
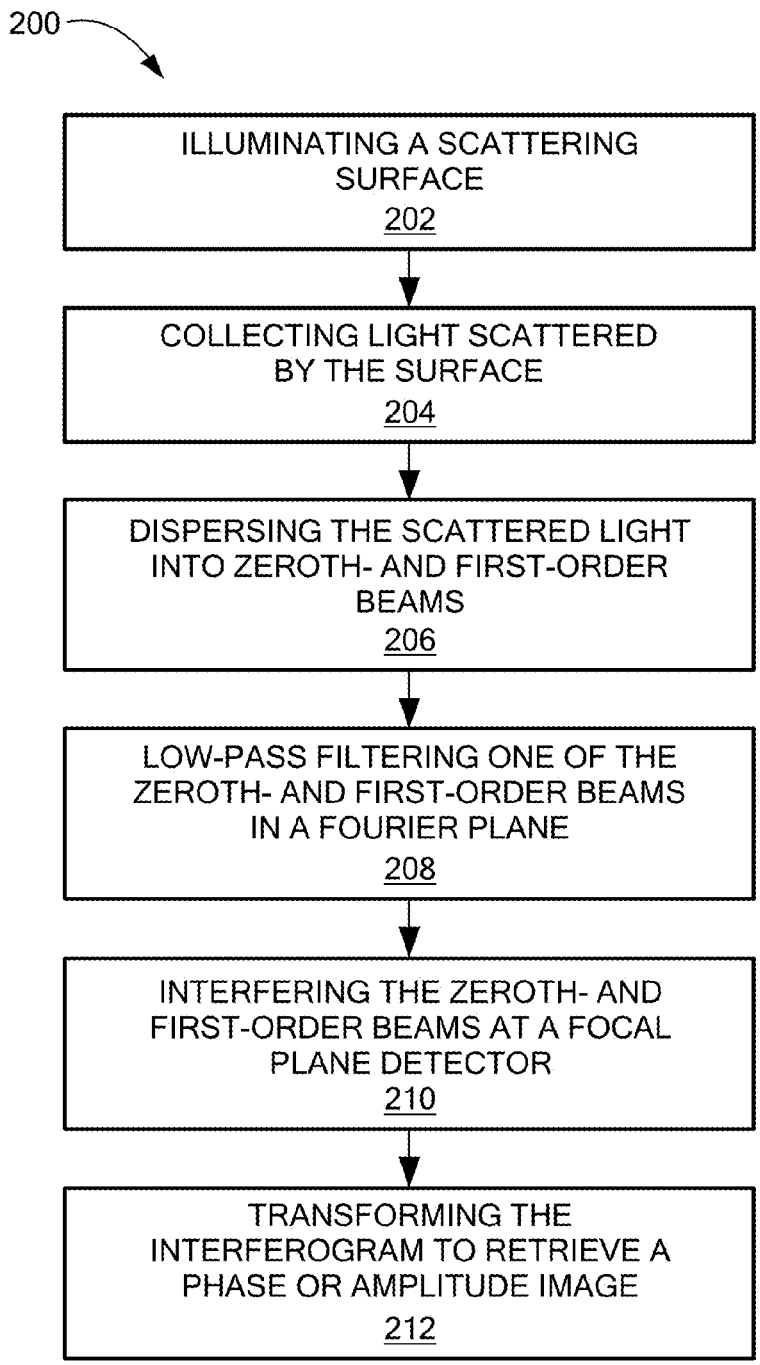
FIG. 2 is a flow chart depicting steps of a method for determining feature heights in accordance with an embodiment of the present invention.

A method for determining feature heights in accordance with one embodiment of the present invention, designated generally by numeral 200, is now described with reference to FIG. 2. The scattering surface, typically a semiconductor substrate or wafer undergoing processing, is illuminated 202 with substantially spatially coherent light. Light scattered by the scattering surface is collected 204 and dispersed 206, by a grating or otherwise, into zeroth- and first-order beams. A spatial Fourier transform of the zeroth- and first-order beams is created and one of the beams is low-pass filtered 208 in a Fourier plane. The zeroth- and first-order beams are interfered 210 at a focal plane detector to generate an interferogram, and the interferogram is transformed 212 to retrieve a spatially resolved either a quantitative phase image, or an amplitude image, or both, of the scattering surface.

Example I

Unprocessed Wafer

In accordance with embodiments of the present invention, epi-DPM may provide accurate topographic height maps relative to other points in the image and therefore may be advantageously made insensitive to any common mode motion of the sample. To characterize the spatial and temporal path length noise of the epi-DPM method described herein, a plain, unprocessed n⁺ GaAs wafer (heavily n-doped) was imaged repeatedly in succession. The successive imaging yielded a time-lapse series of images containing 256 frames at 8.93 frames/s. A 10× objective (NA=0.25) provided a lateral resolution of 1 μm, with a field of view of approximately 160 μm×120 μm. After recovering the height images, a quadratic fit of each individual image was subtracted off. The linear portion of the fit corrects for the tilt of the sample and the angle of interference in camera plane 148 while the quadratic portion corrects for the quadratic phase front of the beam across the field of view. After correction, the spatial standard deviation of the image at each time frame, $\sigma_{xy}(t)$, was computed, yielding a median value of 11.2 nm. Insertion of rotating diffuser 150 into collimated beam 108, as described above, reduced the spatial noise floor to 10.4 nm. "Flat Fielding" to Remove Instrumental Spatial Non-Uniformities Imperfections in optical components lead to non-uniformities across the field of view in the phase of the light that impinges on the sample, however, insofar as they reflect a characteristic of the instrument, they are reproducible and may largely be removed through proper system calibration. In accordance with embodiments of the invention, a second time lapse series of images may be collected, with, or without, rotating diffuser 150, at a spatial location separated from a region of interest by several fields of view, typically approximately 0.5 mm. Time-averaging the spatially displaced images for use as a calibration image for subtraction from each primary non-time averaged image yielded, in Example I provided above, a measured spatial noise of 4.6 nm without the diffuser and 2.8 nm with the diffuser. The temporal sensitivity, defined as the median of a histogram of σt(x, y), was 1.1 nm without diffuser 150, and 0.6 nm with the diffuser.

Example II

Etched Micropillars

In order to characterize the accuracy of epi-DPM, images of micro-pillars fabricated by wet etching of an n⁺ GaAs wafer were collected. Photolithography and developing were done using a standard SPR 511A photoresist recipe. A small degree of non-uniformity among multiple micro-pillar heights was observed, which is typical of the fabrication process. For epi-DPM, the spatial standard deviation in height was 6.3 nm for the unetched circular pillar and 4.8 nm for the etched region. The calibration procedure used previously (in Example I) on the flat sample helps but is not as effective on non-planar surfaces.

Figure 3A:
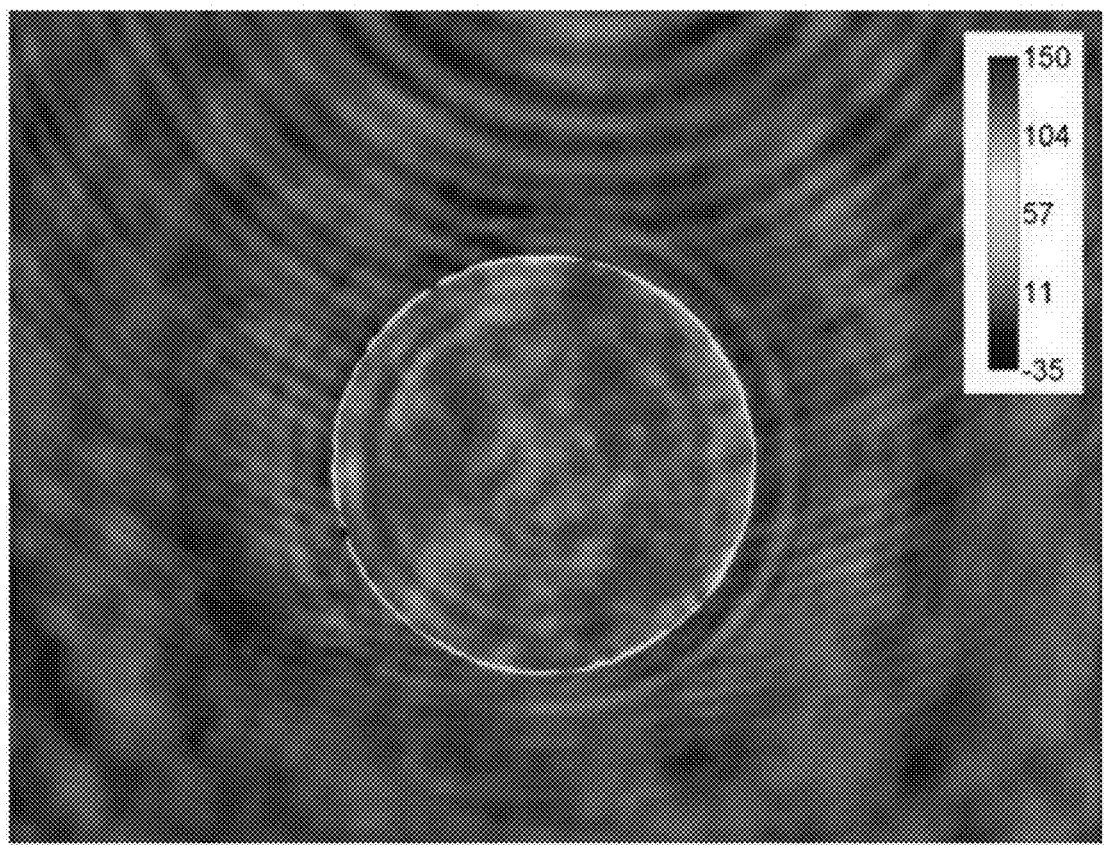
FIG. 3A is a false-color image depicting a height measurement of a micropillar of the surface of a semiconductor substrate, using epi-diffraction phase microscopy in accordance with an embodiment of the present invention.
Figure 3B:
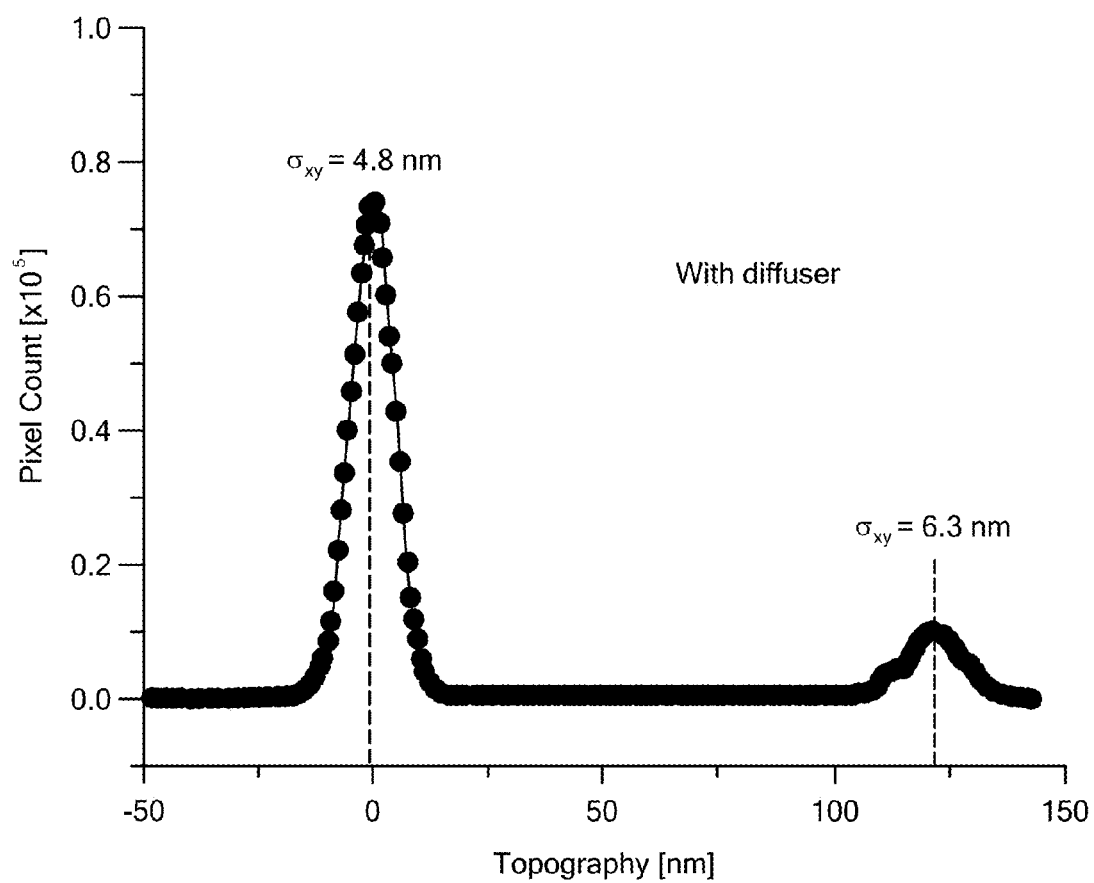
FIG. 3B is a histogram of the heights depicted in FIG. 3A.

FIG. 3A shows the epi-DPM image of a micro-pillar with the diffuser. The positions of the pillar and etched region were extracted from the histogram of the epi-DPM image, as shown in FIG. 3B, by fitting each histogram peak to a separate Gaussian distribution. Although the spatial noise from an individual pixel is several nanometers, the standard error in the mean position is 0.1 nm after averaging and assuming that pixels more than a diffraction spot diameter apart are independent. Thus, the mean height was 122.0±0.1 nm. This agrees with measurements taken by a Tencor Alpha-Step 200 surface profiler and a Hitachi S-4800 scanning electron microscope (SEM), which yielded values between 120-130 nm for the various micro-pillars. A small degree of non-uniformity among the micro-pillar heights was observed, which is typical of the fabrication process. For epi-DPM, the spatial standard deviation in height was 6.3 nm for the unetched circular pillar and 4.8 nm for the etched region.

The calibration procedure used previously on the flat sample of Example I helps but is not as effective on non-planar samples. Laser speckle, due to interference, cannot be properly removed by subtracting the calibration image which contains the interference pattern for a flat surface. Spatial noise may be lower on the etched region but higher than on the flat sample because it has a larger flat area, which enables better subtraction. Also, the wet etching process tends to smooth the semiconductor surface.

Example III

Dynamic Topographic Changes During Etching

Figure 4A:
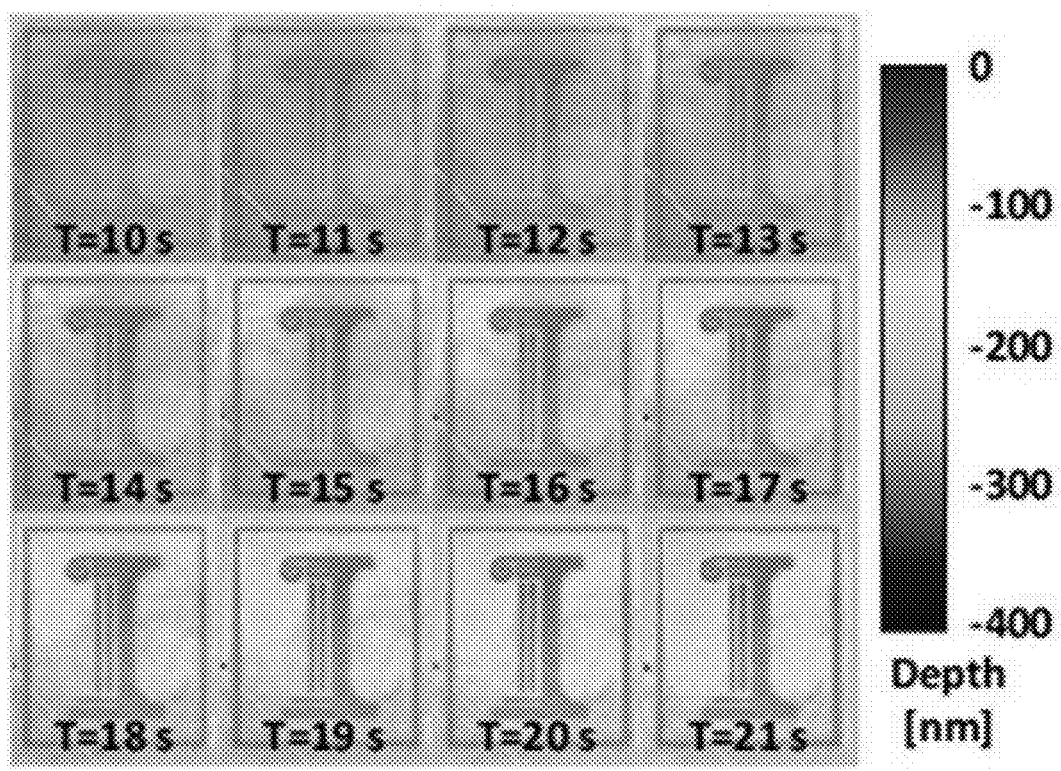
FIG. 4A is a false-color top-down view of a logo during a wet etching process, after successive time intervals indicated in each frame, in accordance with an embodiment of the present invention.
Figure 4B:
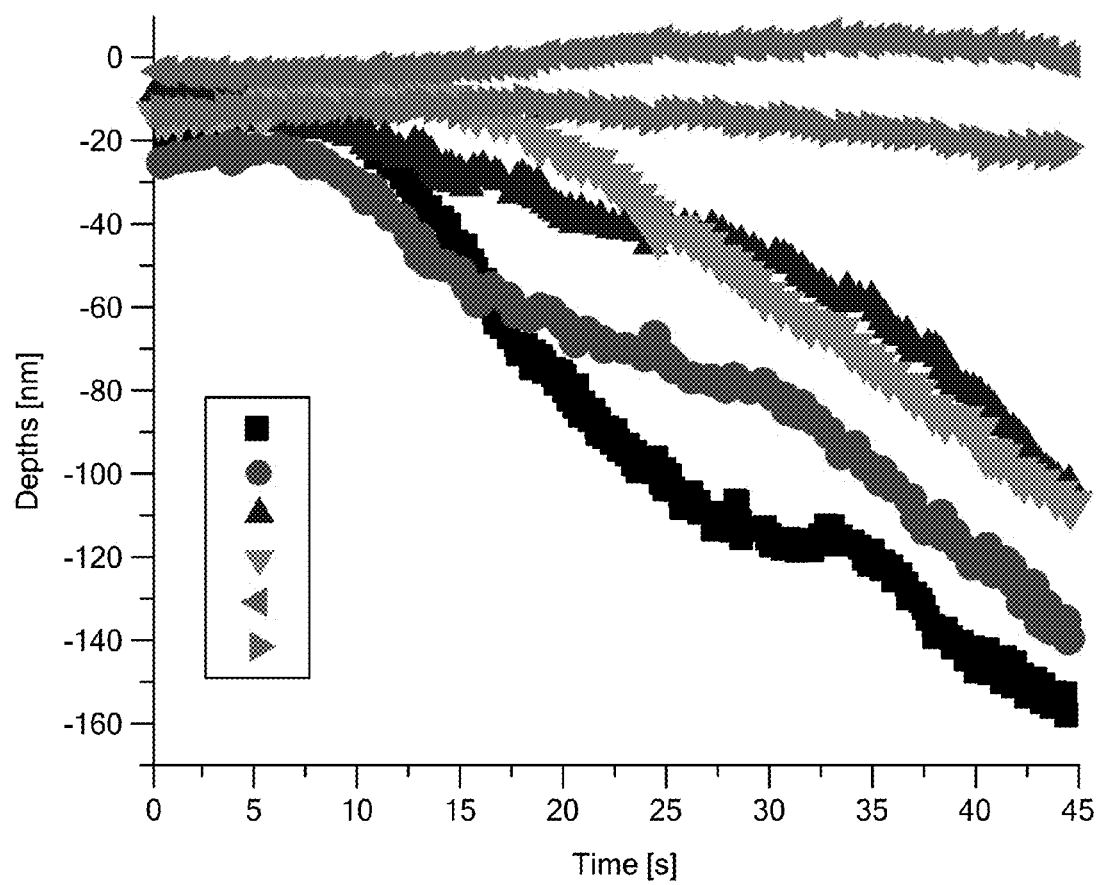
FIG. 4B shows plots of etching depths over time at distinct points of an etched pattern.

The sensitivity and accuracy results described above underscore the capability of epi-DPM to monitor dynamic topographic changes at the nanoscale. Exploiting this feature, the topography of an n+ GaAs wafer was monitored while being etched with a solution of $H_3PO_4:H_2O_2:H_2O$. A total of 400 frames were acquired at 8.93 frames/s, for a total of 44.8 seconds. The resulting epi-DPM movie revealed that it took approximately 10 seconds for the etchant to diffuse into the field of view and begin etching. The montage in FIG. 4A indicates the spatial inhomogeneity and the time evolution of the etching process. The quantitative information provided by epi-DPM allows a measurement of etch rates in a spatially and temporally resolved manner. FIG. 4B plots etch depth profile at discrete points across the sample.

Photochemical Etching

In combination with epi-DPM, and in accordance with alternate embodiments of the present invention, photochemical etching may advantageously offer an efficient means to fabricate structures with precisely controllable topography. In photochemical etching, light absorption in a semiconductor increases the concentration of minority carriers which then diffuse to the surface and thereby increase the rate of dissolution and corrosion of the semiconductor in an oxidizing solution. Photochemical etching is described, for example, in Houle, *Photochemical etching in silicon: the influence of photogenerated charge carriers*, Phys. Rev. B, vol. 39, pp. 10120-32, (1989), which is incorporated herein by reference. Since the etch rate is limited by the supply of minority carriers to the surface, illumination accelerates the etching process. Photochemical etching techniques are particularly well suited for fabricating complex gray-scale structures which are typically very difficult or expensive to produce using standard photolithographic techniques.

Example IV

Photochemical Etching of Arrays of Microlenses

Figure 5A:
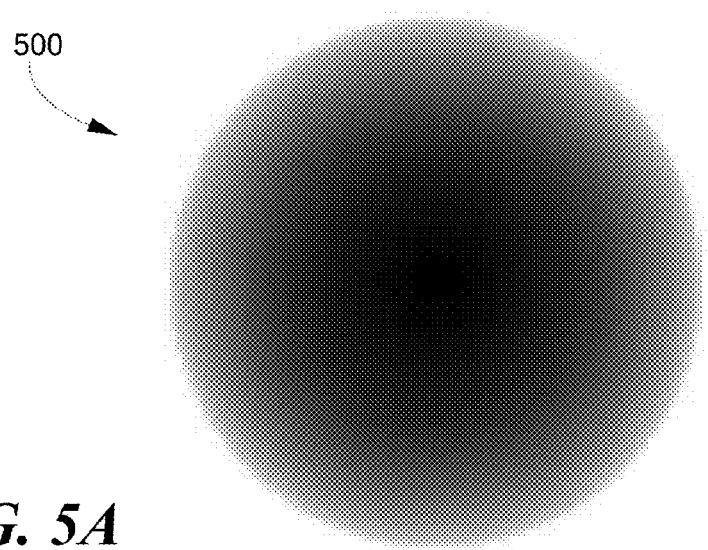
FIG. 5A shows a mask delivered by a projector to a sample plane for fabrication of a microlens, an epi-DPM image of which, in accordance with an embodiment of the present invention, in shown in FIG. 5B.
Figure 5B:
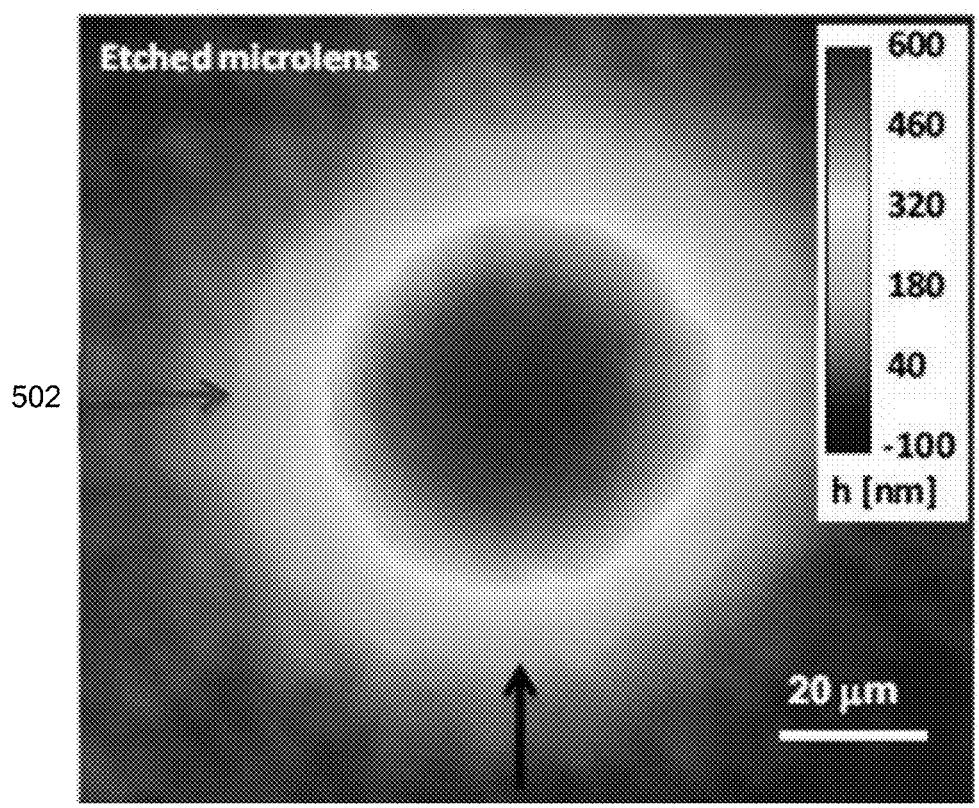
FIG. 5C shows height profiles of a 2×2 array of microlenses fabricated using techniques in accordance with embodiments of the present invention.

As an example of photochemical etching capabilities, epi-DPM was used to image microlens structures fabricated by photochemical etching. Light produced by light projector 160 (EPSON Powerlite S5 EMP-S5, for example) in the illumination path, such that gray-scale or color images delivered by a computer can be mapped onto the sample, as shown in FIG. 1. Individual microlenses were fabricated using a digital image as an optical mask, which may be implemented by a spatial light modulator (SLM), for example, in order for the mask to be programmable and amenable to modification in real time. FIG. 5A shows a pattern of specified intensity distribution (otherwise referred to as mask 500) delivered by projector 160 to sample plane 131 (shown in FIG. 1), while FIG. 5B is the corresponding epi-DPM image of the resulting fabricated microlens. Projector 160 may also deliver a pattern of both specified intensity distribution and specified color distribution. The samples were plain, unprocessed n+ GaAs wafers and the etch time was calibrated to 2 minutes for a lens height of 500 nm and a diameter of 100 μm. The measured height and diameter for the resulting microlens depicted in FIG. 5B were 590 nm and 100 μm, respectively. Both the projector and the imaging laser etch the sample. The laser etches uniformly while the projector etches the pattern. The laser power was minimized to reduce unwanted etching. At sample plane 131, the laser power density was 0.64 $mW/cm^2$ while the projector delivered 8.9 $mW/cm^2$. The power density of the laser under normal imaging conditions without attenuation was 57 $mW/cm^2$.

While profiles through the mask and the microlens indicate that the photochemical etching process is a nonlinear function of light irradiance delivered to a particular site, epi-DPM can measure precisely this nonlinear relationship and, in turn, provide a calibration curve for etching structures with prescribed profiles. In addition, imaging with epi-DPM can render the feedback necessary to fine-tune the etching process in real time, by controlling the projector light intensity across the field of view. Moreover, the use of color images from the projector can achieve selective or non-selective etching of materials with different bandgaps. For example, red light from the projector of wavelength 700 nm will create minority carriers in GaAs but not in $Al_xGa_{1-x}As$ for x>0.3 nor in $In_{0.49}Ga_{0.51}P$, thereby enabling selective etching of GaAs relative to $Al_xGa_{1-x}As$ and to $In_{0.49}Ga_{0.51}P$, whereas blue light of wavelength 450 nm will create minority carriers in GaAs, in $Al_xGa_{1-x}As$ for any composition x, and in $In_{0.49}Ga_{0.51}P$, enabling non-selective etching of the materials.

Figure 5C:
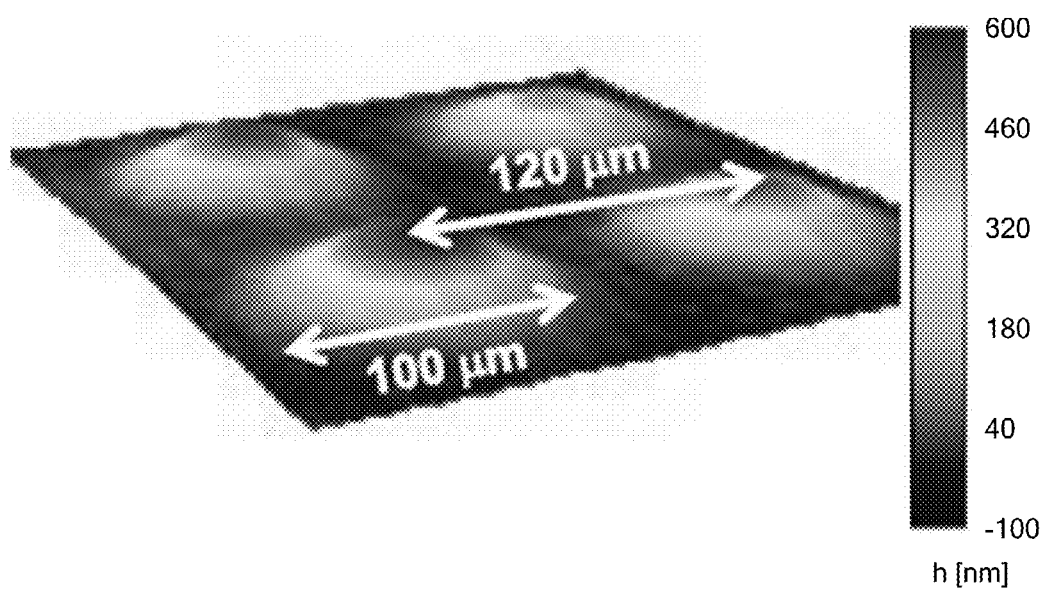

As a further illustration, 2×2 arrays of microlenses were fabricated, and profiled by epi-DPM as shown in FIG. 5C. The optical mask 500 in this case contained five 2×2 arrays of gray-scale lenses with 100-μm diameters and 120-μm pitch. The resulting heights ranged from about 425 to 590 nm across the array, the diameters from 95 to 105 and the pitch from 120 to 125 μm. Better height uniformity across the array may be advantageously achieved by adaptive control in a feedback loop, using controller 170 to govern the mask pattern 500 projected by projector 160 in order to achieve a specified height profile on the semiconductor surface.

In preferred embodiments of the present invention, disclosed methods for quantitative phase imaging of scattering surfaces characterized by a height profile relative to a fiducial plane may be implemented as a computer program product for use with a computer system. Such implementations may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or analog communications lines) or a medium implemented with wireless techniques (e.g., microwave, infrared or other transmission techniques). The series of computer instructions embodies all or part of the functionality previously described herein with respect to the system. Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies. It is expected that such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of the invention may be implemented as a combination of both software (e.g., a computer program product) and hardware. Still other embodiments of the invention are implemented as entirely hardware, or entirely software (e.g., a computer program product).

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A method for characterizing a height profile of a scattering surface of arbitrary profile relative to a fiducial plane, the method comprising:
   a. illuminating the scattering surface with substantially spatially coherent light;
   b. collecting light scattered by the scattering surface;
   c. providing a blazed diffraction grating disposed within an image plane of a microscope, the blazed grating adapted to create multiple copies of an image of the scattering surface of arbitrary profile, with one copy of the image in each diffraction order and with power maximized in a first diffraction order;
   d. dispersing the scattered light by means of the blazed diffraction grating into zeroth- and first-order beams;
   e. creating a spatial Fourier transform of the zeroth- and first-order beams;
   f. low-pass filtering one of the zeroth and first-order beams in a Fourier plane, thereby forming a reference beam of a Mach-Zehnder interferometer;
   g. interfering the zeroth- and first-order beams at a focal plane detector to generate an interferogram; and
   h. transforming the interferogram to retrieve at least one of a spatially resolved quantitative phase image and an amplitude image of the scattering surface.

2. A method in accordance with claim 1, wherein the scattering surface is disposed at an interface between a solid and a surrounding tenuous medium.

3. A method in accordance with claim 1, wherein the step of dispersing includes grating diffraction.

4. A method in accordance with claim 1, further comprising converting the spatially resolved quantitative phase image into a height image.

5. A method in accordance with claim 1, wherein the step of illuminating further includes diffusing illuminating light.

6. A method in accordance with claim 1, wherein transforming the interferogram includes performing a spatial Hilbert transform.

7. A method in accordance with claim 1, wherein transforming the interferogram includes unwrapping phase by application of a branch cut algorithm.

8. A method in accordance with claim 1, wherein low-pass filtering is performed by means of a pinhole.

9. A method in accordance with claim 1, wherein low-pass filtering is performed by means of a spatial light modulator disposed in the Fourier plane.

10. A method in accordance with claim 1, wherein the scattering surface is a semiconductor.

11. A method in accordance with claim 1, wherein the scattering surface is a semiconductor concurrently undergoing semiconductor processing.

12. A method in accordance with claim 1, wherein the scattering surface is a semiconductor undergoing a process selected from the group of including chemical etching, dry etching, chemical-mechanical planarization, polishing and backside grinding, epitaxial growth, regrowth, material deposition, coating, lithographic patterning, or material modification through UV exposure, ion implantation, plasma ashing, baking, annealing, oxidation and surface passivation.

13. An epi-diffraction phase microscope comprising:
   a. a source of a substantially spatially coherent illuminating beam for illuminating a scattering surface characterized by a height profile relative to a fiducial plane;
   b. an objective lens for collecting light from the source scattered by the scattering surface and forming a first image within an image plane of the epi-diffraction phase microscope;
   c. a diffraction grating disposed within the image plane of the epi-diffraction phase microscope for relaying a zeroth order beam and adapted for diffracting a second image identical to the first image into a first-order diffracted beam;
   d. a first Fourier lens for transforming the zeroth-order beam and first-order diffracted beam into respective Fourier transform fields in a Fourier transform plane;
   e. a Fourier transform space mask for low-pass filtering one of the zeroth-order and first-order beams in the Fourier transform plane thereby forming a reference beam of a Mach-Zehnder interferometer;
   f. a second Fourier lens for recombining the zeroth-order beam and first-order diffracted beam at a focal plane detector.

14. An epi-diffraction phase microscope in accordance with claim 13, further comprising a diffuser for diffusing the substantially spatially coherent illuminating beam prior to illumination of the scattering surface.

15. An epi-diffraction phase microscope in accordance with claim 13, wherein the Fourier transform space mask is implemented by a pinhole.

16. An epi-diffraction phase microscope in accordance with claim 13, wherein the Fourier transform space mask is implemented by a spatial light modulator.

17. An epi-diffraction phase microscope in accordance with claim 13, wherein the grating is a transmission grating.

18. A method for fabricating structures on a surface of a semiconductor, the method comprising:
   a. subjecting the surface to a wet etching solution;
   b. projecting illumination onto the surface so as to generate a pattern of specified intensity;
   c. measuring a height profile of the surface using a method in accordance with any one of claims 1-10; and
   d. regulating the pattern of specified intensity so as to achieve a specified target height profile.

19. A method in accordance with claim 18, wherein the pattern of specified intensity is also a pattern of specified color.

* * * * *